United States Patent [19]

Lin

[11] Patent Number: 5,108,542
[45] Date of Patent: Apr. 28, 1992

[54] SELECTIVE ETCHING METHOD FOR TUNGSTEN AND TUNGSTEN ALLOYS

[75] Inventor: Chen-Hsi Lin, Cupertino, Calif.

[73] Assignee: Hewlett Packard Company, Palo Alto, Calif.

[21] Appl. No.: 572,188

[22] Filed: Aug. 23, 1990

[51] Int. Cl.⁵ .................................................. C23F 1/00
[52] U.S. Cl. ..................................... 156/643; 156/646; 156/656
[58] Field of Search ............ 156/643, 646, 656, 659.1, 156/664; 252/79.1; 204/192.32, 192.35

[56] References Cited

U.S. PATENT DOCUMENTS

| | | | |
|---|---|---|---|
| 4,298,419 | 11/1981 | Suzuki et al. | 156/657 |
| 4,675,073 | 6/1987 | Douglas | 156/643 |
| 4,692,205 | 9/1987 | Sachdev et al. | 156/643 |
| 4,713,141 | 12/1987 | Tsang | 156/643 |
| 4,786,360 | 11/1988 | Cote et al. | 156/643 |
| 4,797,178 | 1/1989 | Bui et al. | 156/643 |
| 4,836,886 | 6/1989 | Daubenspeck | 156/643 |
| 4,836,887 | 6/1989 | Daubenspeck et al. | 156/643 |
| 4,842,687 | 6/1989 | Jucha et al. | 156/643 |
| 5,842,676 | 6/1989 | Jucha et al. | 156/643 |

Primary Examiner—Steven Weinstein
Assistant Examiner—Anthony Weier

[57] ABSTRACT

A method of plasma etching tungsten containing films such as is found in semiconductor interconnects. The etch method is conducted under reactive ion etch conditions in a plasma etch reactor using a gas mixture of $CF_4$ and $O_2$. The $O_2$ preferably makes up 20% to 60% of the gas mixture by volume. The etch method is highly selective to titanium disilicide, titanium nitride and silicon dioxide.

12 Claims, 2 Drawing Sheets

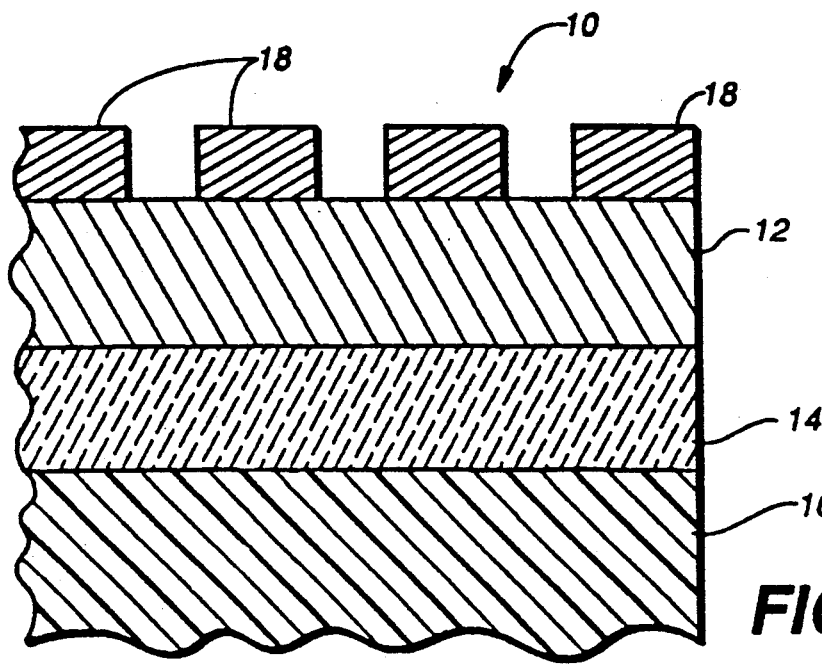
FIG._1
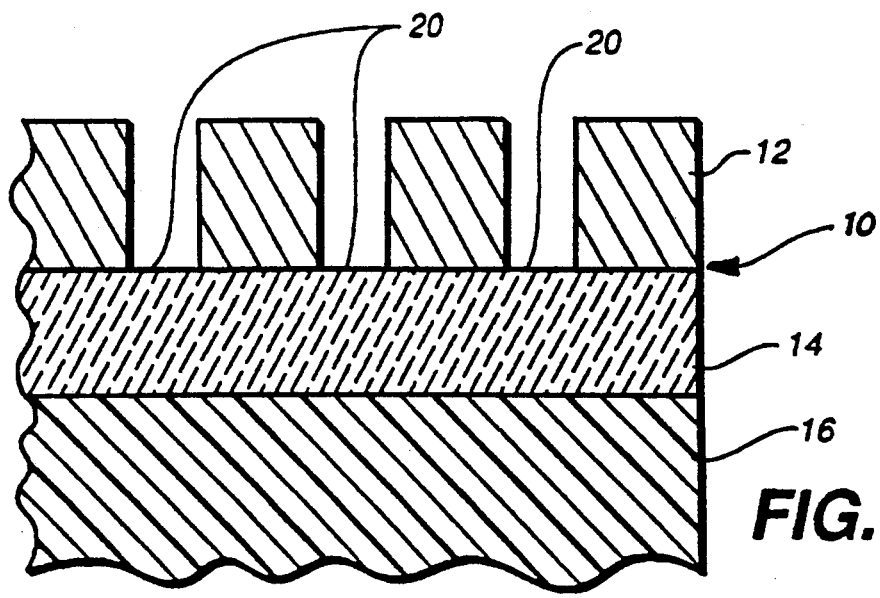
FIG._2

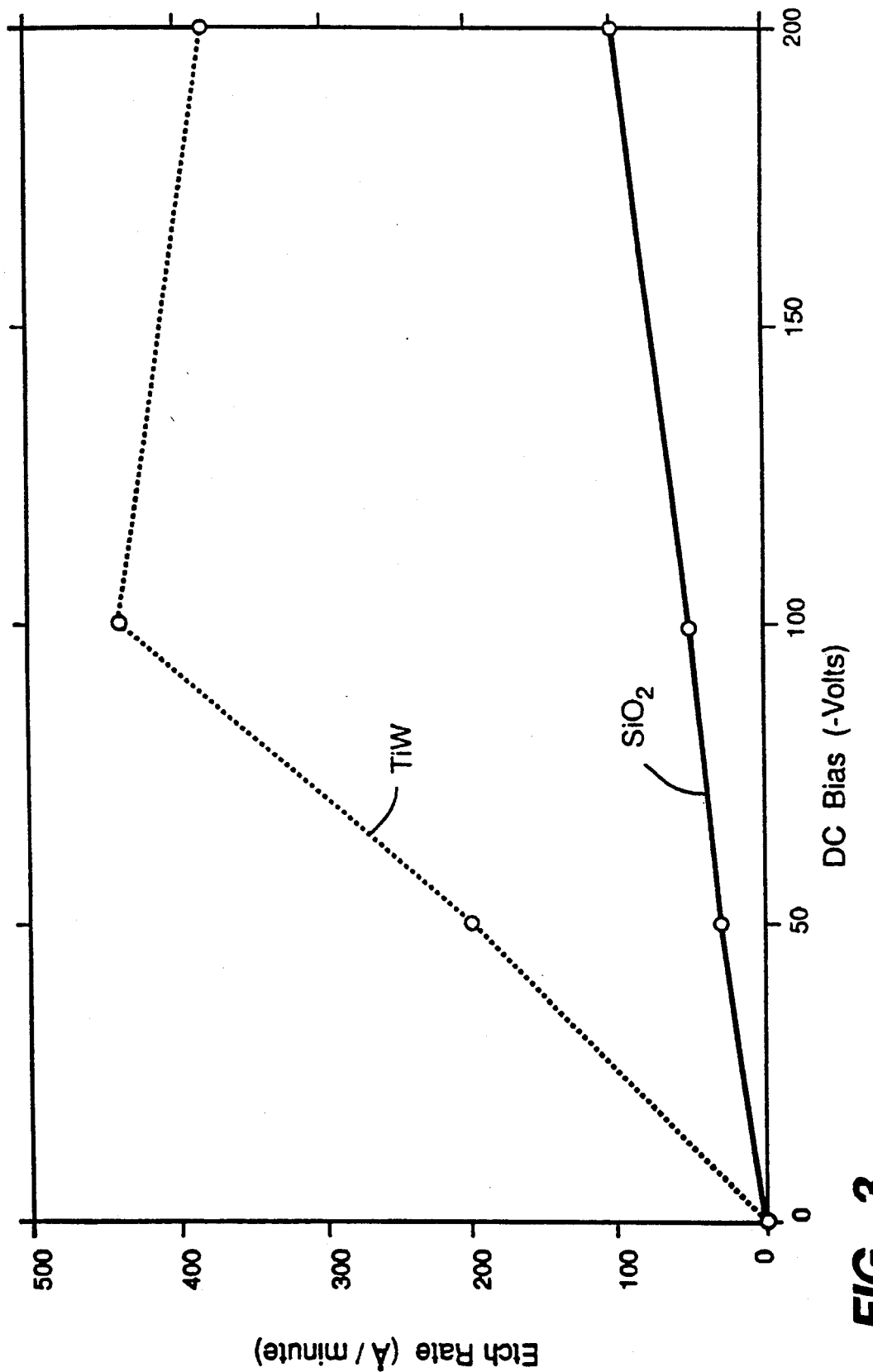
FIG._3

SELECTIVE ETCHING METHOD FOR TUNGSTEN AND TUNGSTEN ALLOYS

TECHNICAL FIELD

The present invention relates to plasma etching methods and more particularly to methods for etching tungsten containing interconnects in silicon patterned integrated circuits.

BACKGROUND ART

In advanced integrated circuit technology, titanium-tungsten and tungsten films are often used to create transistor interconnects. To form the interconnects, a layer of titanium-tungsten or tungsten may be deposited by chemical vapor deposition techniques (CVD) or sputtered over an underlayer which is generally made of either titanium disilicide, titanium nitride or silicon dioxide. A titanium nitride underlayer, in particular, provides a good base to which tungsten adheres. To create the interconnects it is necessary to remove part of the titanium-tungsten or tungsten layer without significantly affecting the underlayer. Several methods for doing this have been proposed.

One method is to use plasma etching in which a glow discharge is utilized to produce chemically reactive species from a relatively inert molecular gas. The etching gas is selected so as to generate species which react chemically with the material to be etched, and whose reaction product with the etched material is volatile. Examples of known plasma etching processes are given below.

In U.S. Pat. Nos. 4,842,687 and 4,842,676, methods of etching tungsten films are disclosed using a gas mixture which includes a fluorine source ($SF_6$), a bromine source (HBr) and a hydrocarbon source such as methane. The etching methods described in these patents are selective of silicon dioxide and photoresist layers. Etch rate ratios of 2-3 to 1 are obtained using these methods.

Daubenspeck et al. U.S. Pat. No. 4,836,887 describes a selective etching method for tungsten using a fluorinated gas, an oxidant and 15-20 percent of a chlorofluorocarbon gas. This method provides a maximum etching rate ratio between tungsten and photoresist of less than 2.5. It is also suggested that high etch rates for silicon containing films can be obtained using this etching method.

In U.S. Pat. No. 4,836,886, Daubenspeck describes a method for etching tungsten and silicon with trifluorochloromethane and at least 50 percent oxygen. High etch rates are achieved for both tungsten and silicon with this method. Again, a maximum etch rate ratio of less than 2.5 was achieved with this method with respect to tungsten and photoresist.

U.S. Pat. No. 4,797,178 describes plasma cleaning methods in which a metallic layer, e.g. tungsten, is etched using a large mass inert gas (such as argon) and $CF_4$ and $O_2$. The large mass gas mechanically removes any polymerized fluorocarbons that form on the surface and which tend to block etching.

U.S. Pat. No. 4,786,360 describes a selective etching method for tungsten using a binary mixture of chlorine gas and 25-45 percent oxygen. This etching method provides high etch rates for tungsten and titanium nitride and is highly selective with respect to dielectrics such as boro-phososilicate glass (BPSG), phososilicate glass (PSG) and polymers such as polyimide.

Tsang in U.S. Pat. No. 4,713,141 discloses an anisotropic plasma etching method for tungsten. With this method, a gas mixture of $SF_6$ and $Cl_2$ is used wherein the concentration of chlorine is between 20-50%.

Sachdev et al., in U.S. Pat. No. 4,692,205 describe an ion etch method using a silicon polyimide etch barrier and $CF_4$ and $O_2$ reactive ion etchants. The $CF_4/O_2$ gas mixture effectively etches the silicon polyimide barrier layer under reactive ion etching conditions.

Douglas in U.S. Pat. No. 4,675,073 teaches an etching method for TiN which has improved selectivity with respect to $TiSi_2$. The method uses a mild fluorine source, such as $CF_4$; a reducing electrode, such as silicon or graphite to scavenge fluorine; a relatively low flow rate; and a substrate temperature between 60° C. and 100° C.

While the above etching methods offer good etch rates for tungsten and tungsten containing films, these methods tend to etch silicon containing films as well. Indeed, with some methods the silicon films are etched faster than the metal films. Not only do these prior art methods etch silicon containing films, these methods also tend to significantly etch the underlayers made of titanium disilicide, titanium nitride and silicon dioxide. Thus, often etch barriers are used, or etch times are carefully controlled when etching tungsten containing films with the prior art methods so as to not over-etch these underlayers.

In view of the above, it is an object of the present invention to provide a method for etching tungsten and titanium-tungsten films which is highly selective of the underlayers made of titanium disilicide, titanium nitride and silicon dioxide.

SUMMARY OF THE INVENTION

The above object has been achieved by a method of plasma etching in which the etch rate of underlayers is greatly reduced and the etch rate of tungsten containing film remains at a high level. This is accomplished by carefully controlling the plasma gases used for etching, with respect to relative compositions, flow rate, and dc bias voltage employed in the method.

More particularly, the novel method employs reactive ion etching (RIE), i.e. plasma etching under low pressure conditions with a gas flow wherein the plasma bombards an object mounted on an electrode. The etching method is carried out in a plasma etch reactor in which the object to be etched, such as a semiconductor wafer, is placed on a radio-frequency electrode. The gases used in this method consist of carbon tetrafluoride ($CF_4$) and oxygen ($O_2$) It was found that by carefully controlling the etch process parameters of gas flow rate, gas mixture composition, and the bias voltage on the electrode, high selectivity could be achieved. Indeed the process etches sputtered titanium-tungsten films at a rate of about 15-30 times faster than the etch rates for titanium disilicide ($TiSi_2$) or titanium nitride (TiN) films, and about 15 times faster than the etch rate for the thermally grown silicon dioxide ($SiO_2$) film.

Such high selectivity with underlayers of $TiSi_2$ or TiN is due primarily to the effects of oxygen on the etching process. Whereas with $SiO_2$, the high selectivity is due primarily to the electrode voltage used. In practice, the exact process conditions that produce the desired high selectivity etching for a given reactor must be empirically derived. Nonetheless, the process conditions noted above appear to be critical for any reactor to achieve high selectivity.

For example, the specific process conditions for an Applied Material etcher model 8130 were determined from tests conducted by the assignee of the present invention. High selectivity was achieved by setting the $CF_4$ flow rate at about 40 SCCM and the $O_2$ flow rate within the range of 10-50 SCCM. An electrode voltage of $-100$ volts or more was found to enhance selectivity. A reactor pressure of about 30 mTorr and a temperature of about 45° C. were conditions which were constant throughout these tests mainly because these are standard for the reactor that was used. The flow rates used were also somewhat dependent on the capacities of the reactor. Accordingly, these exact conditions and flow rates are not critical, but the method may be operated within a range of low pressures, moderate temperatures and flow rates.

Several gas mixtures were tested for their ability to provide high selectivity, but surprisingly the gas combination of $CF_4/O_2$ gave the best results. This was surprising in that $CF_4/O_2$ is known to produce high etch rates in silicon-containing films. However, in use with the present etching method, this combination actually suppressed the etch rates for $TiSi_2$ and $SiO_2$ as well as the etch rate for TiN. Moreover, the etch rates for tungsten-containing films were at maximums, while the etch rates for the underlayers were at or near minimums. Having low flow rates for these gases may or may not be an important factor in achieving these results. As noted previously, relatively low flow rates were used because of the constraints placed on the process by the reactor model that was used. High selectivity may, therefore, also be achieved with higher flow rates than those tested.

It was also found from these tests that the etch rates for titanium disilicide and titanium nitride unexpectedly decrease linearly with additional amounts of $O_2$ in the $CF_4/O_2$ gas mixture, so that the percentage of $O_2$ relative to the $CF_4$ is an important measurement. The etch rates only begin to decline after $O_2$ makes up at least 10-20% of the plasma. It is presently not known why these etch rates decrease with additional $O_2$, but it is believed that some kind of passivation reaction takes place at the surface of the $TiSi_2$ and TiN. While additional $O_2$ suppresses the etching of $TiSi_2$ and TiN, the etch rate of tungsten-containing film advantageously increases.

Concerning the bias voltage, tests further showed that the titanium-tungsten etch rate increases rapidly as electrode voltage varies from 0 to $-100$ volts and remains virtually unchanged thereafter with any further decrease in voltage. Thus, there appears to be a "saturation" voltage for the etching of titanium-tungsten. Silicon dioxide, on the other hand, exhibits an etch rate which increases linearly over a wide range of electrode voltages well beyond $-100$ volts, but appears to be insensitive to other process parameters. Therefore, the maximum selectivity between titanium-tungsten and silicon dioxide is achieved with the electrode voltage set at or near the saturation voltage, which in this case is about $-100$ volts.

An advantage of the present etching process is the improvement seen in the selectivity between titanium-tungsten and tungsten films, and the underlayers described above. Indeed this process improves the selectivity by about 5-10 times, compared to prior art processes. Such high selectivity would then allow for etching without etch barriers or extremely precise control of etch times, thereby rendering the manufacture of interconnects less complex and improving yields.

BRIEF DESCRIPTION OF THE DRAWINGS

FIG. 1 is a cross-sectional view of a semiconductor laminate structure prior to being etched in accord with the method of the present invention.

FIG. 2 is a cross-sectional view of the laminate structure of FIG. 1 following etching in accord with the method of the present invention.

FIG. 3 is a graph showing the effects of electrode voltage on the etch rates of TiW and $SiO_2$.

BEST MODE FOR CARRYING OUT THE INVENTION

Referring to FIG. 1, a cross-section of a simplified semiconductor laminate structure 10 is shown. Typically the structure would be in wafer form. The design of the semiconductor circuits requires the formation of interconnections. Titanium-tungsten and tungsten films are widely used to form interconnects and contact plugs used in advanced silicon based integrated circuits. To make the interconnects, titanium-tungsten or tungsten films are sputter or vapor deposited on the surface of the laminate to form a surface layer 12. This layer is deposited on an underlayer 14 which is typically made of titanium disilicide ($TiSi_2$), titanium nitride (TiN) or silicon dioxide ($SiO_2$) films. The two layers 12 and 14 are then supported on a support layer 16, such as a silicon wafer. Other layers and structures may be found in the laminate, but these are not shown to simplify the illustrations. A mask 18 is used to define the desired pattern.

Desirable characteristics of an etch process include 1) high selectivity against etching the mask layer material 18; 2) high selectivity against etching the material 14 under the film 12 being etched; 3) an etch rate sufficiently rapid to allow high throughput; 4) uniform etching across the entire wafer, from wafer-to-wafer, and from run-to-run; 5) an unlikelihood of damage to substrates; and 6) a low incidence of particulate and film contamination. Of these six characteristics, the present invention particularly addresses the second and the third.

A plasma etch process having the above characteristics was found for tungsten containing films in which carbon tetrafluoride ($CF_4$) and oxygen ($O_2$) gases are used. The process requires controlling the parameters of gas flow rate, mixture composition, and electrode voltage to fall within specified ranges. It is noted that the gases $CF_4$ and $O_2$ do not in themselves cause etching absent a glow discharge. Thus, when a discharge of $CF_4$ is created, it is not the $CF_4$ molecules that participate in the etching reaction. Instead, the etching is accomplished by the radical species which are created by the dissociation of $CF_4$ molecules; namely fluorine atoms. When $O_2$ is added to the $CF_4$ feed gas the density of fluorine atoms increases. This has the effect of increasing the etch rate of tungsten, while surprisingly decreasing the etch rates of titanium disilicide and titanium nitride.

The novel etching process for tungsten containing films is preferably carried out in a plasma etch reactor, such as found in Applied Material's metal etcher model No. 8130. Such a plasma etch reactor is described in U.S. Pat. No. 4,842,683. The reactor contains a hexagonal-shaped radio-frequency electrode (hexode) on which items to be etched are placed. The reactor walls are cylindrical and serve as the opposite electrode. Several items, e.g. semiconductor wafers, can be processed simultaneously as a batch in plasma reactors of this type. The etching process is performed under reactive ion etching (RIE) conditions.

Referring to FIGS. 1 and 2, once the desired pattern 20 is etched into the tungsten containing surface layer 12, the mask 18 may be removed from the laminate structure 10 by any of the well-known methods in the art. Because of the very high selectivity of the etching method, there is little change in the underlayer 14.

The following Tables 1 and 2 present the results of experiments that verified the properties of the invention. All experiments were carried out using the Applied Materials Etcher 8130 described above.

The experimental runs A1-A6 of Table 1 were carried out under the same conditions of 30 mTorr pressure, 45° C. and with an electrode voltage of −260 volts. Different mixtures of gases were used to see what effect they had on the etch rate (ER) of $TiSi_2$. The results given in Table 1 demonstrate that the combination of $CF_4$ and $O_2$ causes $TiSi_2$ to have a very low etch rate. The other combinations of gases which were tried resulted in higher etch rates.

TABLE 1

| Run | $SF_6$ (SCCM) | $CF_4$ (SCCM) | $Cl_2$ (SCCM) | $N_2$ (SCCM) | $O_2$ (SCCM) | ER $TiSi_2$ (Å/min) |
|---|---|---|---|---|---|---|
| A1 | 25 | — | — | — | — | >300 |
| A2 | 20 | — | 20 | — | — | 300 |
| A3 | — | 40 | 5 | — | — | 175 |
| A4 | — | 40 | — | 10-50 | — | 80 |
| A5 | — | 40 | — | — | 5 | 75 |
| A6 | — | 40 | — | — | 10-50 | <30 |

In runs A1-A4 the lowest etch rate achieved for $TiSi_2$ was found in A4 where $CF_4$ and $N_2$ were used. However, this etch rate of 80 Å/min is still more than 2.5 times faster than the etch rates of run A6, where $CF_4$ and $O_2$ were used. Runs A5 and A6 show the effect oxygen has on the etch rate of $TiSi_2$. In A5 the $O_2$ had a flow rate of 5 SCCM which resulted in an etch rate of 75 Å/min. With increased $O_2$ flow, 10-50 SCCM, the etch rate was less than 30 Å/min., a difference of at least 2.5 times compared to the results of run A5. Thus an $O_2$ flow rate within 10-50 SCCM is preferred. That works out to be about 20%-60% of the total flow when the flow rate of the $CF_4$ is kept at 40 SCCM, plus or minus 4 SCCM. The results for titanium nitride are similar.

In further experimentation, the following conditions were kept constant: the pressure inside the reactor chamber was maintained at 30 mTorr; the temperature was maintained at 45° C.; a negative voltage of −260 volts was applied to the electrode; and the flow rate of $CF_4$ was kept at 40 SCCM, plus or minus 4 SCCM. The only variable was the flow rate of $O_2$. As the flow rate was varied from 5 SCCM to 50 SCCM, the etch rate of $TiSi_2$ linearly decreased from 75 Å/min to less than 30 Å/min. Titanium nitride showed a similar pattern.

Table 2 gives the results of tests which were conducted to see what effect $O_2$ had on the etch rate of titanium nitride for both type I and type II. The test conditions were 30 mTorr pressure, 45° C. and −260 volts on the electrode.

TABLE 2

| RUN | $CF_4$ (SCCM) | $O_2$ (SCCM) | ER TiN Type I (Å/min) | ER TiN Type II (Å/min) |
|---|---|---|---|---|
| C1 | 40 | 5 | 55 | 85 |
| C2 | 40 | 30 | 24 | 52 |

Test runs C1 and C2 show that increasing the $O_2$ flow rate from 5 SCCM to 30 SCCM resulted in a decrease in the etch rates for both TiW type I and type II. Indeed a 56% decrease was seen in Type I, while a 39% decrease was seen in type II. $O_2$ flow rates above 30 SCCM appear to decrease these etch rates even more.

Table 3 shows what effects changes in the electrode voltage have on the etch rates (ER) of titanium-tungsten (TiW) and silicon dioxide ($SiO_2$) In this set of experiments, the flow rate of $CF_4$ was set at 40 SCCM, the flow rate of $O_2$ at 5 SCCM, the pressure at 30 mTorr and the temperature at 45° C.

TABLE 3

| RUN | dc bias (−volts) | ER TiW (Å/min.) | ER $SiO_2$ (Å/min.) | ERR TiW:$SiO_2$ |
|---|---|---|---|---|
| D1 | 0 | 0 | 0 | — |
| D2 | 50 | 200 | 25 | 8:1 |
| D3 | 100 | 440 | 55 | 8:1 |
| D4 | 200 | 380 | 100 | 3.8:1 |

The results of the experimental run D1-D4 demonstrate that the etch rate of TiW is greatest with an electrode voltage of −100 volts. The etch rate of $SiO_2$, on the other hand, increases steadily with increased voltage. The increasing etch rate of $SiO_2$ may be due in part to the effect of increased ionic bombardment caused by a higher bias voltage. This bombardment may help remove nonvolatile residue which then allows etching to occur. The maximum etch rate ratio is more plainly seen in FIG. 3 wherein the results of Table 3 are presented graphically. Accordingly the highest etch rate ratio (ERR) occurs around −100 volts. This ratio is about 8:1 for an $O_2$ flow rate of only 5 SCCM. Higher ratios occur when the flow rate of $O_2$ is increased to its preferred range of 10-50 SCCM. This is due to an increased TiW etch rate as shown in Table 5 below.

Table 4 gives the etch rates for TiW and $SiO_2$ as functions of oxygen flow. The conditions under which tests were performed were 30 mTorr pressure, 45° C. and −100 volts applied to the electrode.

TABLE 4

| RUN | $CF_4$ (SCCM) | $O_2$ (SCCM) | ER TiW (Å/min) | ER $SiO_2$ (Å/min) | ERR TiW:$SiO_2$ |
|---|---|---|---|---|---|
| E1 | 40 | — | 120 | 50 | 2.4:1 |
| E2 | 40 | 5 | 420 | 50 | 8.4:1 |
| E3 | 40 | 10 | 520 | 50 | 10.4:1 |
| E4 | 40 | 15 | 650 | 50 | 13:1 |
| E5 | 40 | 20 | 760 | 50 | 15.2:1 |

Test runs E1–E5 show the dramatic effect the addition of $O_2$ has on the etch rate ratio (ERR) of TiW to $SiO_2$. With an $O_2$ flow rate of 20 SCCM (test run E5) the ERR was above 15:1. This means that this etching method is very selective with respect to $SiO_2$ especially when compared with the prior art etch rate ratios of less than 3:1. Thus, the present etching method provides a five-fold or more improvement in selectivity.

Even greater selectivity is achieved with $TiSi_2$ and TiN. With an etch rate (ER) for TiW of 760 Å/min and an etch rate for $TiSi_2$ of <30 Å/min (from Table I) the etch rate ratio (ERR) of TiW to $TiSi_2$ is at least 25:1 and approaches 30:1. This means nearly a tenfold improvement is achieved over the prior art with respect to the selectivity of $TiSi_2$. Similar results are obtained with respect to TiN.

While the tests above deal with etching TiW films, the present etching method produces similar results with tungsten films as would generally be expected in the art. Moreover, while the tests were performed at a pressure of 30 millitorr, the advantages of the present invention will be realized at other pressures as well. The pressure, however, should remain in the range of 20–40 millitorr.

I claim:

1. A method of etching a tungsten or tungsten allow film comprising the steps of:
    providing a substrate having a lower film of one of titanium nitride and titanium disilicide;
    forming an upper layer of tungsten-containing film on the lower film;
    applying a negative voltage to the substrate; and
    exposing the tungsten-containing film to a plasma comprising a mixture of $CF_4$ and $O_2$ gases supplied under reactive ion etch conditions and in the absence of chlorine, the exposing including supplying the plasma such that the $O_2$ is in the range of 20% to 60% of the plasma by volume, thereby etching the tungsten-containing film at a high rate relative to etching of the lower film.

2. The method of claim 1 wherein said step of exposing further comprises maintaining a stream of $CF_4$ at a flow rate of 40 SCCM, plus or minus 4 SCCM.

3. The method of claim 2 wherein said step of exposing further comprises maintaining a stream of $O_2$ within the range of 10 to 50 SCCM.

4. The method of claim 1 wherein said negative voltage is maintained generally at a minimum saturation voltage at which the etch rate of the tungsten-containing film is substantially unchanged by varying the negative voltage in a negative direction.

5. The method of claim 1 wherein said method is carried out in a plasma etch reactor at a pressure of about 30 millitorr.

6. A method of selective plasma etching a tungsten-containing layer, comprising the steps of:
    providing a substrate having a silicon oxide layer thereon;
    forming a tungsten-containing layer on the silicon oxide layer;
    placing the substrate on an electrode in a plasma etch reactor;
    applying a negative voltage to the electrode, said negative voltage being generally about a saturation voltage; and
    exposing the tungsten-containing film to a plasma environment comprising a mixture limited to $CF_4$ and $O_2$ gases, said $O_2$ gas being 20% to 60% of the mixture by volume, the mixture of gases being fed into the reactor under reactive ion etch conditions whereby the tungsten-containing layer is etched at a rate of at least five times faster than the silicon oxide layer, said saturation voltage being a minimum negative voltage at which the rate of etching the tungsten-containing layer is not increased with negative-going changes to the voltage to the electrode.

7. The method of claim 6 wherein said step of exposing further comprises maintaining a stream of $CF_4$ at a flow rate of about 40 SCCM.

8. The method of claim 7 wherein said step of exposing further comprises maintaining a stream of $O_2$ within the range of 10 to 50 SCCM.

9. The method of claim 6 wherein said step of applying further comprises maintaining said negative voltage at a negative voltage of approximately 100 volts.

10. The method of claim 6 further comprising maintaining said reactor at a pressure of about 30 millitorr.

11. A method of selectively plasma etching a tungsten-containing film, comprising the steps of:
    placing a laminate on an electrode in a plasma etch reactor maintained at a pressure of 20–40 millitorr, the laminate having a tungsten-containing surface film atop an underlayer;
    applying to the electrode a saturation voltage of approximately negative 100 volts; and
    exposing the tungsten-containing surface film to a plasma environment comprising a mixed stream of $CF_4$ and $O_2$ gases in the absence of chlorine, the stream of $CF_4$ being maintained at about a flow rate 40 SCCM and the stream of $O_2$ being maintained within a flow rate of 10 to 50 SCCM, whereby the tungsten-containing film is etched at a rate of at least five times faster than the underlayer.

12. The method of claim 11 wherein said underlayer of the laminate is selected from the group consisting of titanium disilicide, titanium nitride and silicon dioxide.

* * * * *